United States Patent [19]

Pearson

[11] Patent Number: 4,724,612
[45] Date of Patent: Feb. 16, 1988

[54] METHOD FOR WINDING WIRES TO MAKE A HARNESS

[75] Inventor: John R. Pearson, El Monte, Calif.

[73] Assignee: Monogram Industries, Inc., Culver City, Calif.

[21] Appl. No.: 875,399

[22] Filed: Jun. 17, 1986

[51] Int. Cl.⁴ .................................................. H01R 43/00
[52] U.S. Cl. ...................................... 29/850; 29/33 F; 29/755; 269/48.1
[58] Field of Search ..................... 29/33 F, 755, 850; 269/48.1

[56] References Cited

U.S. PATENT DOCUMENTS

| | | |
|---|---|---|
| 2,387,371 | 10/1945 | Wallace . |
| 3,568,562 | 3/1971 | Harwood . |
| 4,399,842 | 8/1983 | Gibbons ............................ 29/850 X |
| 4,537,542 | 8/1985 | Pratt et al. . |
| 4,548,533 | 10/1985 | Pratt . |

FOREIGN PATENT DOCUMENTS

| | | |
|---|---|---|
| 647647 | 7/1937 | Fed. Rep. of Germany . |
| 680232 | 8/1939 | Fed. Rep. of Germany . |
| 712337 | 10/1941 | Fed. Rep. of Germany . |
| 803986 | 10/1936 | France . |
| 887862 | 11/1943 | France . |
| 941581 | 1/1949 | France . |
| 533984 | 2/1941 | United Kingdom . |

OTHER PUBLICATIONS

E. Zapp, European Search Report, 2/9/85, pp. 1-3; 8/29/85, pp. 1-3.

Primary Examiner—Howard N. Goldberg
Assistant Examiner—Taylor J. Ross
Attorney, Agent, or Firm—Pretty, Schroeder, Brueggemann & Clark

[57] ABSTRACT

A method of forming wire harnesses and a cylindrical body pin assembly for connection to a peg board of the type used to form such harnesses is disclosed. The pin assembly comprises a cylindrical pin body and a cylindrical drive nut that are rotated relative to each other to axially move a pair of wire fingers protruding from one end of the pin body. The fingers are received within a hole in the peg board and are moved axially over a spreader disposed between them to separate the fingers and cause an enlarged shoulder on the fingers to abut against the peg board. After a selected number of pin assemblies have been installed in the peg board, wires may be wound around them to form the harness. The outer cylindrical surfaces of the pin body and drive nut are substantially equal in diameter to provide relatively straight, smooth sidewalls. This allows rapid installation and removal of the pin assembly by hand-held or robotic installation tools and, further, prevents the completed harness from catching on the pin assemblies during removal from the peg board, which could cause damage to the harness.

6 Claims, 4 Drawing Figures

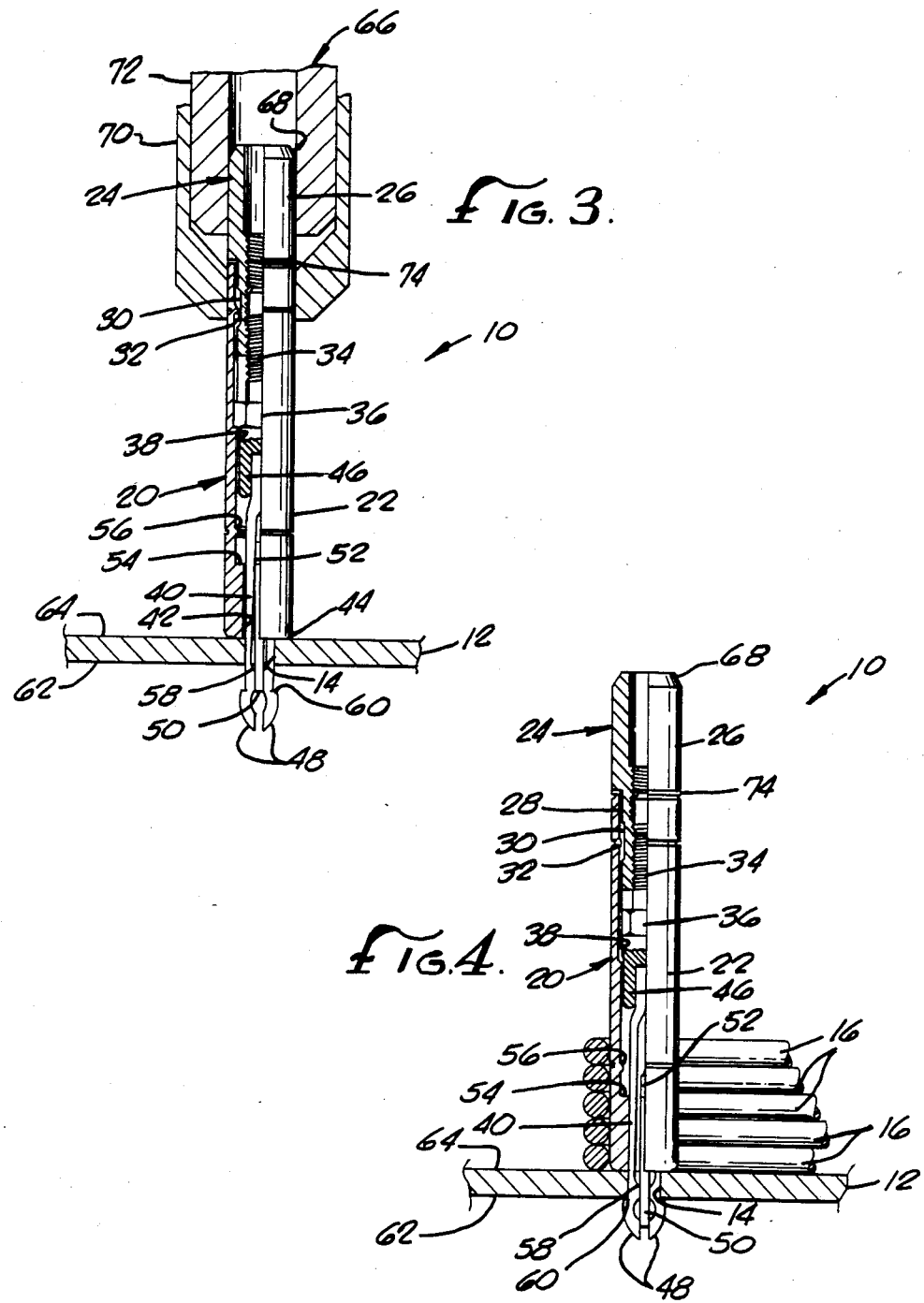

METHOD FOR WINDING WIRES TO MAKE A HARNESS

FIELD OF THE INVENTION

The present invention relates to a cylindrical body pin assembly for connection to a workpiece or peg board of the type used to make wire harnesses, and to a method of winding wires to make such harnesses using this pin assembly.

BACKGROUND OF THE INVENTION

Wire harnesses are used in a variety of electrical applications for connecting a power source to various devices. Generally, wire harnesses comprise pre-fabricated wiring with insulation and terminals ready to be attached to the power source and to one or more devices. To form the multi-wire cable or harness, a plurality of individual wires are connected together in a side-by-side relationship. Depending upon the particular electrical application, the characteristics of the wire harness may vary. For example, the length of the harness and the type and number of wires used to form it may be changed as desired.

Over the years, methods and equipment have been developed to construct wire harnesses. One known method of forming wire harnesses involves positioning a plurality of externally threaded bolts on a peg board or workpiece in a predetermined pattern for enabling wires to be wrapped around the bolts to form the harness. In practice, individual wires are wrapped around the bolts usually one at a time until the desired number of wires is included in the harness. The location of the bolts around the peg board may be arranged so that a wire harness of a particular length is formed. After the desired number of wires has been wrapped around the bolts, the completed harness may be removed from the peg board and sent to another location for further processing as necessary.

In the method and equipment described above, problems have existed in installing and re-positioning the bolts on the peg board, and in removing the completed wire harness from the peg board. For example, installing the bolt in the peg board is done manually and, therefore, involves relatively large amounts of time because usually two persons, one on each side of the peg board, are required to install the bolt. Use of such bolts has a further disadvantage in that the externally threaded bolts often have an enlarged hex head for gripping by a wrench or other installation tool. Thus, when removing the completed wire harness from the peg board, the harness is susceptible to being caught on the external bolt threads, the enlarged hex head, or both. This may cause damage to the wire harness, and it tends to increase operator time in being careful not to snag or damage the harness during removal. Additionally, it is relatively time consuming, after one wire harness has been wound, for two persons to manually remove the bolts and position them in a new location for winding a different harness.

Accordingly, there has existed a need for an improved method for forming wire harnesses and an improved bolt or pin assembly for quick installation into the peg board which prevents the completed harness from being caught on the pin assembly and damaged during removal of the harness. There further has existed a need for a pin assembly that can be rapidly removed and re-positioned in the peg board for winding a different wire harness. The present invention satisfies these needs and provides further related advantages.

SUMMARY OF THE INVENTION

The present invention provides a method of winding wires to form wire harnesses and further provides a cylindrical body pin assembly for connection to a workpiece or peg board of the type used to form such harnesses. The cylindrical outer surfaces of the pin assembly are substantially equal in diameter to provide relatively straight, smooth sidewalls, thus preventing the wires comprising the harness from being caught on the pins when removing the completed harness from the peg board. The pin assembly conveniently may be installed in the peg board manually by one person or by automated techniques in a matter of seconds and, further, may be rapidly removed from the peg board and re-positioned in a new location to form a different wire harness. The pin assembly of this invention furthermore is intended to be simple in construction, reliable in use and relatively inexpensive to manufacture.

The pin assembly comprises a generally cylindrical pin body and an internally threaded cylindrical drive nut, a portion of which is retained within an opening at one end of the pin body. The drive nut is adapted for free rotational movement but limited axial movement with respect to the pin body. A pair of wire fingers extend out of another opening at the other end of the pin body opposite the drive nut for insertion into a hole in the peg board. To secure the pin assembly to the peg board, a spreader disposed between the wire fingers separates them upon axial movement of the fingers into the pin body. Axial movement of the fingers is caused by an externally threaded screw retained within the pin body. One end of the screw is rigidly connected to the fingers, with the other end of the screw threadedly engaging the drive nut. Means are provided for restraining rotation of the screw with respect to the pin body upon relative rotation between the pin body and the drive nut. Rotation of the drive nut relative to the pin body therefore causes axial movement of the screw and attached fingers in or out of the pin body.

To install the pin assembly in the peg board and wind wires to form a harness in accordance with the method of this invention, the fingers are inserted into a hole in the peg board until a nose of the pin body abuts against the outer surface of the peg board. An installation tool then is placed axially over the outer end of the pin body to grip it and hold it against rotation, while a rotating wrench bit of the installation tool grips the drive nut and rotates it in one direction. This relative rotation between the pin body and the drive nut causes axial movement of the screw and fingers outwardly through the pin body. That is, the fingers move into the pin body and over the spreader. As the fingers move outwardly through the pin body, the spreader separates and expands the fingers causing an enlarged shoulder on each of the fingers to abut against the inner surface of the peg board and clamp the pin assembly in position. After a desired number of pin assemblies have been secured to the peg board in a predetermined pattern, the individual wires comprising the wire harness may be wound around the pin assemblies until the proper number of wires have been wound to form the completed harness. Upon completing the wire winding process, the completed harness may be removed from the peg board for further processing as necessary.

The pin assembly of the present invention is adapted for rapid and convenient installation in the peg board manually or by automated or robotic installation techniques. This is made possible by the circumstance that a single installation tool, operated manually by one person or by a robot, may be used to rotate the drive nut relative to the pin body to clamp the fingers to the peg board. Installation and removal time is further reduced because the outer surfaces of the pin body and drive nut are cylindrical. As a result, the installation tool may be easily positioned on the pin assembly without regard to the relative angular orientation between the pin body and the non-rotating wrench bit of the tool, and the relative angular orientation between the drive nut and the rotating wrench bit of the tool. Wrenching tools designed to grip such cylindrical surfaces are disclosed in commonly assigned application Ser. No. 717,947 filed Mar. 29, 1985, now abandoned. The wrenching tool disclosed in that application is adapted for use in both hand-held and robotic installation tools.

The outer cylindrical surfaces of the pin body and drive nut are substantially equal in diameter to provide relatively straight, smooth sidewalls. This has the advantage of preventing the wires of the harness from being caught on the pins when removing the completed harness from the peg board. Additionally, the sidewall of the pin body has a pair of axially spaced annular grooves formed during the manufacturing process which are crimped axially to produce a radially inwardly extending shoulder for captivating the spreader and the rotating drive nut within the pin body. A thrust washer also is provided between the bearing surfaces of the pin body and drive nut to prevent galling and wear between these two surfaces upon rotation of the drive nut to install the pin assembly.

Other features and advantages of the present invention will become apparent from the following detailed description, taken in conjunction with the accompanying drawings, which illustrate, by way of example, the principles of the invention.

BRIEF DESCRIPTION OF THE DRAWINGS

The following drawings illustrate the invention. In such drawings:

FIG. 3 is a side view of the pin assembly, partly in cross-section, showing an installation tool gripping the pin assembly just prior to clamp up against the peg board; and FIG. 4 is a side view of the pin assembly, partly in cross-section, showing the pin assembly fully clamped to the peg board.

DETAILED DESCRIPTION OF THE PREFERRED EMBODIMENT

Figure 1:
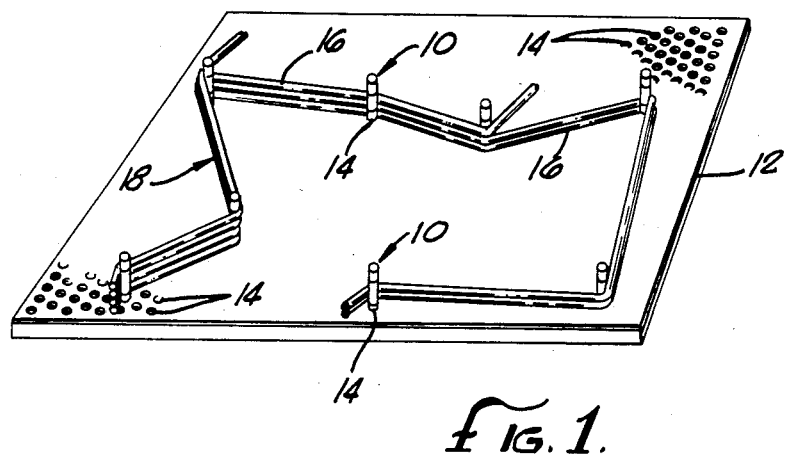
FIG. 1 is a perspective view showing a plurality of pin assemblies embodying the principles of the present invention inserted into a peg board in a predetermined pattern, with wires wound around the pin assemblies to form a harness.

The present invention provides a pin assembly, generally referred to by the reference numeral 10, for connection to a workpiece or peg board 12 of the type used to form wire harnesses and, further, provides a method of winding wires to make such harnesses using this pin assembly. The outer surfaces of the pin assembly are substantially cylindrical and equal in diameter to provide relatively straight, smooth sidewalls and to prevent the harness from being caught on the pins when removing it from the peg board. Moreover, the pin assembly conveniently can be installed in or removed from the peg board manually by one person or by automated techniques in a matter of seconds. The pin assembly of the present invention furthermore is intended to be simple in construction, reliable in use and relatively inexpensive to manufacture.

Referring to FIG. 1 of the drawings, several pin assemblies 10 are shown installed in a predetermined pattern in holes 14 provided in the peg board 12. Although the peg board is illustrated as a substantially planar, one-piece device, it is understood that other types of peg boards and devices may be used. As is known in the art, individual wires 16 are successively wrapped around the pins 10 in a side-by-side relationship to form a completed wire harness 18. FIG. 1 shows four such wires 16 wrapped around the pin assemblies, but it is understood that additional wires can be added and the locations of the pin assemblies altered to form a wire harness 18 having a variety of selected characteristics. The process of winding the wires around the pin assemblies may be accomplished by known procedures and, therefore, need not be explained in detail. For example, some of the wires may branch off of the harness at various locations on the peg board, as indicated at 19.

Figure 2:
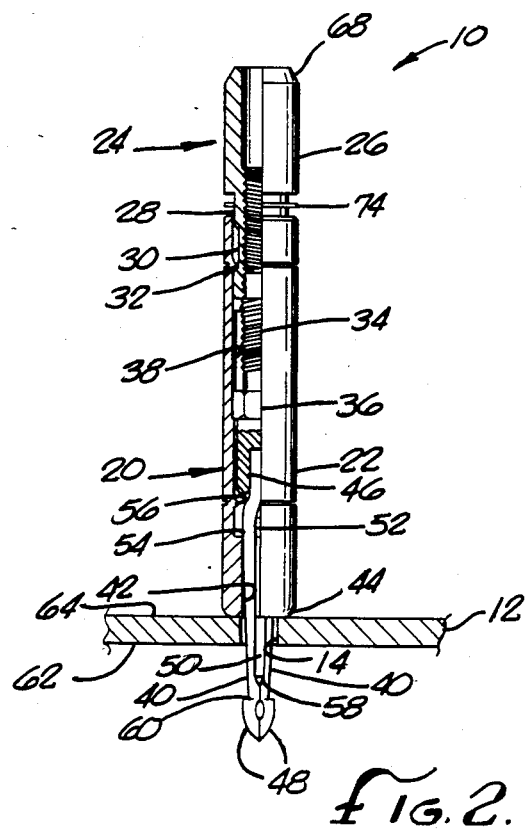
FIG. 2 is a side view of the pin assembly, partly in cross-section, showing the pin assembly inserted into a peg board hole prior to clamp up.

FIGS. 2-4 show side views of the pin assembly 10, partly in cross-section, with the pin assembly inserted into one of the holes 14 in the peg board 12. As illustrated in these figures, the pin assembly comprises a generally tubular pin body 20 having a cylindrical outer surface 22, and a drive nut 24 retained within the pin body which also has a cylindrical outer surface 26. More particularly, an inner portion of the drive nut 24 is received within an opening 28 at the outer end of the pin body and has an annular groove 30 in its outer surface. An inwardly projecting annular shoulder 32 on the inner surface of the pin body extends within the annular groove 30 so that the drive nut 24 is free to rotate with respect to the pin body, yet is restrained axially a limited distance in and out of the pin body by a distance corresponding to the length of the annular grove. The annular shoulder 32 on the pin body 20 is formed in the manufacturing process by creating a groove in the outer surface 22 of the pin body, and then axially compressing or crimping the pin body to produce the inwardly extending annular shoulder. As explained in more detail below, rotation of the drive nut 24 relative to the pin body 20 secures the pin assembly 10 to the peg board 12.

An externally threaded screw 34 retained within the pin body 20 threadedly engages the internally threaded drive nut 24. A portion of the screw is provided with means for preventing rotation of the screw relative to the pin body. In the preferred embodiment, this means for preventing rotation of the screw relative to the pin body comprises a hexagonally shaped outer surface 36 on a portion of the screw 34 for engagement with a matching hexagonally shaped inner surface 38 of the pin body 20. Thus, rotation of the drive nut 24 relative to the pin body 20 moves the screw 34 axially within the pin body, with the hexagonal outer surface 36 of the screw sliding axially with respect to the hexagonal inner surface 38 of the pin body. It is understood that other means may be provided for preventing the screw from rotating with respect to the pin body, such as a key sliding in a slot (not shown).

A pair of identically shaped wire fingers 40 protruding from an opening 42 in the inner end or nose 44 of the pin body 20 are adapted for clamping the pin assembly 10 to the peg board 12. The outer ends of the fingers 40 within the pin body are rigidly connected to the inner end of the screw 34 by a connector 46, with the free inner ends 48 of the fingers projecting out of the opening 42. The free inner ends 48 are normally biased towards each other and make contact when the fingers are in their furthest position from the pin body nose 44, as shown in FIG. 2. Thus, axial movement of the screw 34 with respect to the pin body 20 also causes axial movement of the fingers 40 in and out of the pin body. A spreader 50 also projecting from the opening 42 in the pin body nose is disposed between the fingers. The spreader is retained within the pin body by a cross-member 52 connected to the inner end of the spreader. In the preferred embodiment, the spreader 50 and cross-member 52 comprise an integrally formed, one-piece T-shaped construction known as a "spreader tee." Axial movement of the spreader 50, which spans the opening in the pin body nose through which the fingers project, is prevented by an inwardly projecting inner wall 54 surrounding the opening and an inwardly projecting annular shoulder 56. The cross-member 52 therefore is trapped within an axial space created by the inner wall 54 surrounding the opening and the annular shoulder 56 to prevent axial movement of the spreader. The annular shoulder 56 captivating the spreader is formed by the same manufacturing techniques used to form the annular shoulder 32 that captivates the drive nut 24. Other means may be provided to captivate the spreader 50 by those skilled in the art.

As shown sequentially in FIGS. 2-4, axial movement of the fingers 40 into the pin body 20 causes an inclined surface or ramp 58 on each of the fingers to contact the spreader 50 and expand the fingers over the spreader. Expanding the fingers 40 in this manner separates them and causes them to substantially fill the hole 14 in the peg board 12, as shown in FIG. 3. Further axial movement of the fingers into the pin body causes an enlarged outer shoulder 60 on each of the fingers to abut against an inner surface 62 of the peg board and clamp the peg board between the shoulders 60 and pin body nose 44.

To install the pin assembly 10 in the peg board 12, the fingers 40 are inserted into the peg board hole 14 until the nose 44 of the pin body 20 abuts against an outer surface 64 of the peg board, as shown in FIG. 2. An installation tool 66 then is moved axially onto the outer end of the pin assembly. The outer end of the drive nut 24 may have a chamfer 68 to facilitate insertion of the tool. In practice, the pin assembly usually is inserted into the installation tool first and then positioned in the peg board hole 14 by movement of the tool to guide the fingers 40 through the hole. Referring to FIG. 3, the installation tool 66 includes a non-rotating wrench portion 70 to grip the pin body 20 and hold it against rotation, and a rotating wrench bit 72 to grip the drive nut 24 and rotate it in one direction to clamp the pin assembly to the peg board. Actuation of the installation tool causes relative rotation between the pin body and the drive nut which, in turn, causes outward axial movement of the screw 34 and fingers 40. That is, the fingers move into the pin body and over the spreader 50 so that the fingers expand. The installation tool 66 is actuated until the enlarged shoulders 60 of the fingers are firmly clamped against the inner surface 62 of the peg board 12, as shown in FIG. 4. The installation tool then is removed. After a desired number of pin assemblies have been positioned in the peg board in a pre-determined pattern, the wires may be wrapped around the pin assemblies to form the harness.

Accordingly, the method of winding wires 16 to form a wire harness 18 using the pin assembly 10 and peg board 12 comprises the steps of inserting the fingers 40 into the hole 14 until the enlarged shoulders 60 of the fingers extends beyond the inner surface 62 of the peg board. After this, the pin body 20 is held against rotation while rotating the drive nut 24 to cause axial movement of the fingers until the peg board is clamped between the enlarged shoulders 60 and the pin body nose 44. When a desired number of pin assemblies have been installed in the peg board, the wires 16 are wrapped around them to form the harness 18.

During partial installation of the pin assembly 10 as illustrated in FIG. 3, it is noted that the drive nut 24 has moved axially inward toward the pin body 20 from its initial position shown in FIG. 2. To prevent wearing or galling between the opposing surfaces of the pin body 20 and drive nut 24, an annular thrust washer 74 is positioned between them. Before engaging the thrust washer, however, the drive nut moves axially a length of at least one turn of the threaded screw 34 in order to provide threaded engagement prior to clamping of turning force. In the preferred embodiment, the outer diameter of the thrust washer is substantially the same as that of the pin body 20 and drive nut 24.

In the preferred embodiment, all components of the pin assembly 10, including the pin body 20, drive nut 24, screw 34, fingers 40, spreader 50 and thrust washer 74 are constructed from steel alloys. For example, heat treatable steel alloys are selected for their fabrication properties and ability to withstand repeated clamping and unclamping actions, involving high torque and clamping forces, with minimal wear and breakage of the pin assembly components. It is understood however, that both metallic and non-metallic materials may be used.

In accordance with the present invention, the outer cylindrical surfaces 22 and 26 of the pin body 20 and drive nut 24, respectively, are substantially equal in diameter to provide relatively straight, smooth sidewalls. This uniform external configuration of the pin body and drive nut provides several important advantages in constructing wire harnesses 18.

One significant advantage is the speed with which the pin assembly 10 may be installed in the peg board 12. As shown in FIG. 3, the installation tool 66 is positioned axially over the outer end of the pin assembly, with the non-rotating wrench portion 70 of the tool engaging the pin body 20, and the rotating wrench bit 72 of the tool engaging the drive nut 24. Thus, access to only one side of the peg board 12 is needed to install the pin assembly. Such installation can be carried out manually by one person in a matter of seconds, or by a robot or other automated techniques with equal or greater speed. Wrenching tools designed to grip cylindrical surfaces such as those of the pin body 20 and drive nut 24 are disclosed in commonly assigned application Ser. No. 717,947, filed Mar. 29, 1985. The tool wrenching portions disclosed in that application are adapted for use in both hand-held and robotic installation tools.

Installation time for the pin assemblies 10 further is reduced because the outer surfaces 22 and 26 of the pin body 20 and drive nut 24, respectively, are cylindrical, therefore eliminating the need to account for any angular misalignment of these surfaces with respect to the angular orientation of the wrenching portions 70 and 72 of the installation tool 66. By way of example to illustrate this point, if the outer surfaces of the pin body and drive nut were of the conventional hexagonal configuration, then any angular misalignment between these surfaces and the corresponding hexagonally shaped tool wrenching portions would prevent the tool from moving axially to grip these surfaces and install the pin assembly. With such hexagonally shaped surfaces, each of the tool wrenching portions would have to be rotated slightly until they aligned with the pin body and drive nut hexagonal surfaces before the tool could be properly positioned and actuated to clamp the pin assembly to the peg board. It could take some time to align these surfaces and, therefore, cause operator fatigue and increased operational and labor costs when installing large numbers of pin assemblies.

Another important advantage of the pin assembly 10 is that the outer cylindrical surfaces 22 and 26 of the pin body 20 and drive nut 24, respectively, are substantially equal in diameter. This provides straight or flush sidewalls and a relatively smooth transition between the outer surfaces of the pin body and the drive nut, as shown in FIG. 4. Thus, after all of the wires 16 comprising the completed harness 18 have been wrapped around the pin assemblies on the peg board 12, the wires will not snag or become caught on the pin assemblies during removal of the harness from the peg board. Since there are no irregularities or protrusions on the smooth cylindrical outer surfaces 22 and 26 of the pin assembly large enough to snag or catch the wires, the harness may be removed from the peg board without damage. The smooth cylindrical outer surfaces of pin assembly also permit a more rapid removal of the harness. If desired, a drive nut 24 having a diameter smaller than the pin body 20 may be used, and still permit removal of the completed harness without damage.

It will be appreciated that the advantages discussed above with respect to installing the pin assembly 10 in the peg board 12 also apply to removing the pin assembly from the peg board and re-positioning it in another hole in the peg board. To remove the pin assembly, the rotating wrench bit 72 of the installation tool 66 is rotated in an opposite direction from that to install the pin assembly. This moves the screw 34 and thus the fingers 40 axially out of the pin body 20 until the ramps 58 on each of the fingers slide over the spreader 50 and the free ends 48 of the fingers approach each other. With the free ends of the fingers in this position, as shown in FIG. 2, their combined thickness is diametrically small enough to permit removal of the pin assembly from the peg board hole 14 and re-positioning in another hole for winding a different harness.

From the foregoing, it will be appreciated that the pin assembly 10 of this invention can be quickly and easily installed in or removed from the peg board 12 by one person or by automated techniques in a matter of seconds. The cylindrical outer surfaces 22 and 26 of the pin body 20 and drive nut 24, respectively, are substantially equal in diameter and provide relatively straight, smooth sidewalls to prevent damage to the wires 16 when removing the completed business 18 from the peg board. The invention further provides a method for winding wires using the pin assembly to form a wire harness.

While a particular form of the invention has been illustrated and described, it will be apparent that various modifications can be made without departing from the spirit and scope of the invention. Accordingly, it is not intended that the invention be limited, except as by the appended claims.

I claim:

1. A method of winding wires using a workpiece having a plurality of holes, and using a plurality of pin assemblies of the type having an axially extending pin body of larger size than the holes in the workpiece, the pin body at one end being adapted to contact the workpiece on one side thereof, actuatable gripping means extending from the one end of the pin body, the gripping means being small enough to pass through any selected one of the holes in a collapsed condition and for expanding to an expanded position upon actuation to overlap the workpiece at an opposite side thereof from the pin body, expanding means within the pin body for expanding the gripping means upon actuation from the collapsed condition to the expanded position, and an axially extending drive nut connected to the pin body at its opposite end for actuating said gripping means, the method comprising the steps of:
   (a) providing a cylindrical external surface along the length of the pin body;
   (b) providing a cylindrical external surface on the drive nut that is substantially the same diameter as the cylindrical external surface on the pin body;
   (c) inserting the gripping means of the pin assembly into a hole in the workpiece until the gripping means is inserted beyond the opposite side of the workpiece from the pin body;
   (d) actuating the drive nut and expanding the gripping means from the collapsed condition to the expanded position until the pin body is clamped tightly against the one side of the workpiece;
   (e) repeating steps (c)–(d) until a plurality of pin assemblies have been connected to the workpiece; and
   (f) winding wires around the pin assemblies until a plurality of wires have been wound on the workpiece.

2. A methof of winding wires using a workpiece having a plurality of holes, and using plurality of pin assemblies of the type having a pin body having an outer tool gripping surface, an internally threaded drive nut connected to one end of the pin body and having an outer tool gripping surface, an externally threaded screw within the pin body in threaded engagement with the drive nut, a pair of fingers connected to the screw and protruding from the pin body from an end opposite the drive nut, said fingers having an enlarged outer shoulder, a spreader connected to the pin body and disposed between the fingers to separate them upon axial movement of the fingers into the pin body, and means for preventing rotation of the screw relative to the pin body, the method comprising the steps of:
   (a) providing a cylindrical surface on the outer tool gripping surface of the pin body;
   (b) providing a cylindrical surface on the outer tool gripping surface of the drive nut;
   (c) inserting the fingers of the pin assembly into a hole in the workpiece until the enlarged shoulders of the fingers are inserted beyond the inner surface of the workpiece;
   (d) gripping the pin body to hold it against rotation, while
   (e) rotating the drive nut in one direction to move the fingers axially over the spreader until the workpiece is clamped between the pin body and the enlarged shoulders of the fingers;

(f) repeating steps (c) through (e) until a plurality of pin assemblies have been connected to the workpiece; and (g) winding wires around the pin assemblies until a plurality of wires have been wound on the workpiece.

3. The method of claim 2, further comprising the step of making the cylindrical surfaces on each of the pin body and the drive nut substantially the same diameter to provide a relatively straight, smooth cylindrical surface on the pin assembly.

4. The method of claim 2 further comprising the step of making the cylindrical surface on the drive nut smaller in diameter than the cylindrical surface on the pin body.

5. The method of claim 2, further comprising the step of positioning the pin assemblies around the workpiece in a predetermined pattern.

6. The method of claim 5, further comprising the steps of:

(a) removing the wires from the workpiece;

(b) re-positioning a plurality of the pin assemblies around the workpiece in a predetermined pattern; and (c) winding wires around the pin assemblies until a plurality of wires have been wound on the workpiece.

* * * * *